United States Patent
Yeong et al.

(10) Patent No.: US 9,303,327 B2
(45) Date of Patent: Apr. 5, 2016

(54) ELECTRIC COMPONENT WITH AN ELECTROPHORETICALLY DEPOSITED FILM

(71) Applicant: Infineon Technologies AG, Neubiberg (DE)

(72) Inventors: Sung Hoe Yeong, Port Klang (MY); Lay Yeap Lim, Batu Berendam (MY); Tien Shyang Law, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 13/738,833

(22) Filed: Jan. 10, 2013

(65) Prior Publication Data
US 2014/0192500 A1    Jul. 10, 2014

(51) Int. Cl.
| H05K 1/18 | (2006.01) |
| C25D 13/12 | (2006.01) |
| H01L 23/29 | (2006.01) |
| H01L 21/56 | (2006.01) |
| H01L 23/31 | (2006.01) |

(52) U.S. Cl.
CPC ............... *C25D 13/12* (2013.01); *H01L 21/56* (2013.01); *H01L 23/29* (2013.01); *H01L 23/3157* (2013.01); *H01L 2924/0002* (2013.01)

(58) Field of Classification Search
CPC .... H05K 1/0306; H05K 1/056; H05K 3/4069
USPC .......... 361/750, 762, 783, 760; 174/256, 258
See application file for complete search history.

(56) References Cited

U.S. PATENT DOCUMENTS

| 3,911,475 | A | 10/1975 | Szedon et al. | |
| 4,695,515 | A | 9/1987 | Shirai et al. | |
| 5,196,098 | A | 3/1993 | Rodriguez et al. | |
| 5,607,818 | A | 3/1997 | Akram et al. | |
| 6,031,279 | A * | 2/2000 | Lenz | 257/686 |
| 7,329,617 | B2 | 2/2008 | Li et al. | |
| 7,821,128 | B2 * | 10/2010 | Ewe et al. | 257/724 |
| 8,049,338 | B2 * | 11/2011 | Delgado et al. | 257/775 |
| 8,178,390 | B2 | 5/2012 | Mahler et al. | |
| 2007/0045745 | A1 * | 3/2007 | Ewe et al. | 257/356 |
| 2007/0176303 | A1 * | 8/2007 | Murai et al. | 257/787 |
| 2007/0216274 | A1 * | 9/2007 | Schultz et al. | 313/46 |
| 2007/0235810 | A1 * | 10/2007 | Delgado et al. | 257/356 |
| 2011/0159296 | A1 * | 6/2011 | Maenaka et al. | 428/416 |
| 2012/0208325 | A1 * | 8/2012 | Chung | 438/124 |

* cited by examiner

*Primary Examiner* — Yuriy Semenenko
(74) *Attorney, Agent, or Firm* — Slater & Matsil, L.L.P.

(57) ABSTRACT

A system, a packaged component and a method for making a packaged component are disclosed. In an embodiment a system comprises a component carrier, a component disposed on the component carrier and an insulating layer disposed on an electrically conductive surface of at least one of the component carrier or the component, wherein the insulating layer comprises a polymer and an inorganic material comprising a dielectric strength of equal or greater than 15 ac-kv/mm and a thermal conductivity of equal or greater than 15 W/m*K.

20 Claims, 4 Drawing Sheets

ELECTRIC COMPONENT WITH AN ELECTROPHORETICALLY DEPOSITED FILM

TECHNICAL FIELD

The present invention relates generally to a packaged component and a method of manufacturing thereof, and in particular, to an electrophoretic deposition (EPD) of a film on a packaged component.

BACKGROUND

The necessity to provide smaller, thinner, lighter, cheaper electronic systems with reduced power consumption, more diverse functionality and improved reliability has driven a stream of technological innovations in all technical fields involved. This is certainly also true for the areas of assembly and packaging which provide protective enclosure against mechanical and thermal outside influences, as well as chemical or irradiation-induced attacks.

SUMMARY OF THE INVENTION

In accordance with an embodiment a system comprises a component carrier, a component disposed on the component carrier and an insulating layer disposed on an electrically conductive surface of at least one of the component carrier or the component, wherein the insulating layer comprises a polymer and an inorganic material (inorganic elements or inorganic chemical compounds) comprising a dielectric strength of equal or greater than 15 ac-kv/mm and a thermal conductivity of equal or greater than 15 W/m*K.

In accordance with an embodiment a method for manufacturing a packaged component comprises placing a component on a component carrier, encapsulating with an encapsulation body at least a portion of the component and the component carrier and electrophoretic co-depositing organic molecules and inorganic elements thereby forming an insulating film on a conductive surface of the component, the component carrier or the encapsulation body.

In accordance with an embodiment a packaged component comprises a component carrier, a component disposed on the component carrier and an encapsulation body at least partially encapsulating the component carrier and the component. The packaged component further comprises an insulating layer disposed on a heat sink of the component carrier, wherein the insulating layer comprises a polymer and an inorganic material comprising a dielectric strength of equal or greater than 15 ac-kv/mm and a thermal conductivity of equal or greater than 15 W/m*K.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely electrophoretic deposition (EPD) of an insulating film on metal surfaces. Embodiments of the invention may also be applied, however, to EPD of a film on other surfaces (including conductive surfaces). Moreover, embodiments of the invention may be applied to other electrochemical deposition processes such as electroplating processes.

Embodiments of the invention provide uniform coating thicknesses for an insulating layer on surfaces. Further embodiments provide a cost efficient way for coating complex surfaces with an insulating layer. Finally, embodiments of the invention provide co-deposition of organic molecules and an inorganic material with excellent electrical insulation properties and excellent thermal conductive properties.

Figure 1:
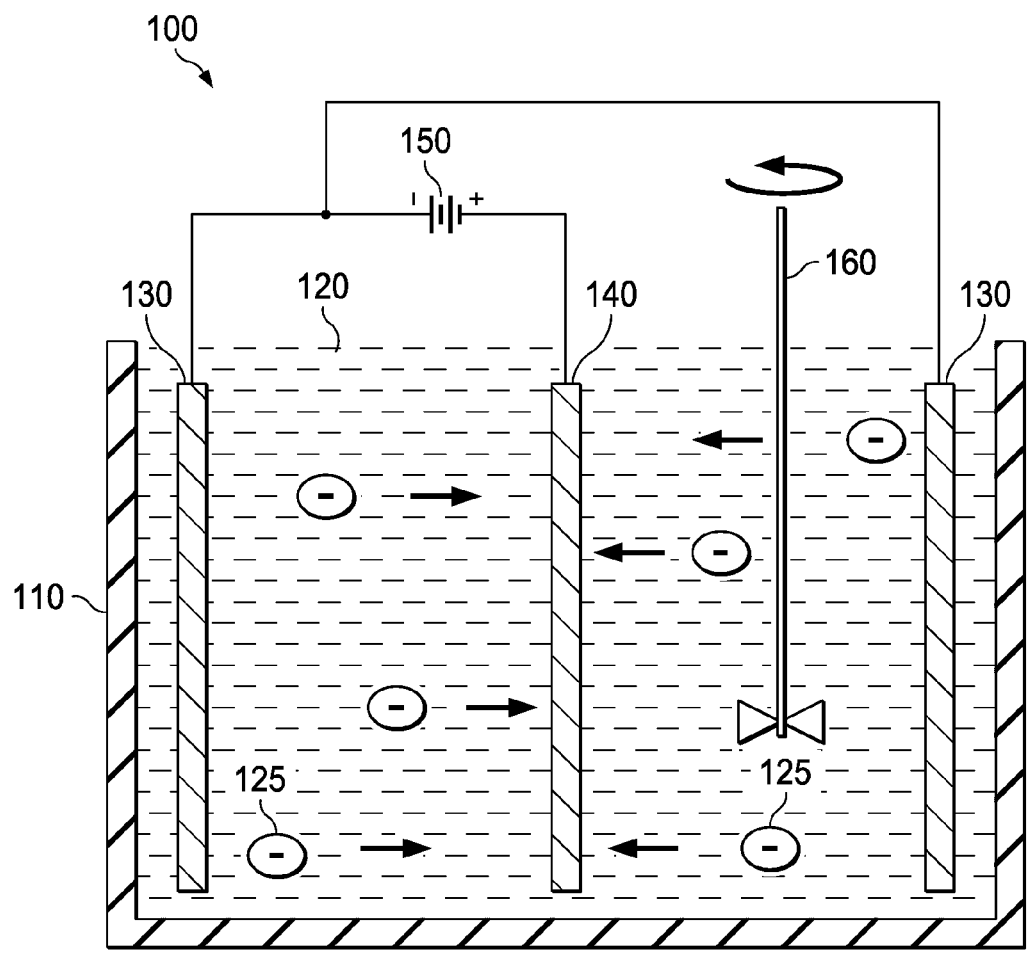
FIG. 1 illustrates an electrophoretic deposition (EPD) process tool.

FIG. 1 shows an example of an electrophoretic deposition (EPD) process tool 100 that is used to deposit an insulation layer on a surface such as a heat sink. The EPD process tool 100 comprises a reactor chamber 110 (e.g., a bath) that is filled with a liquid medium 120. A first electrode (e.g., anode) 140 is positioned in the center of the reactor chamber 110 where the EPD occurs. Two second electrodes (e.g., cathodes) 130 are located in equal distances from the first electrode 140 in peripheral regions of the reactor chamber 110. A direct current (DC) power supply 150 is in conductive contact to the first electrode 140 and the second electrodes 130. The DC power provides the electric field to initiate and maintain the movement of negatively charged particles 125 moving towards the first electrode 140. The charged particles 125 are organic molecules such as monomers or polymers comprising a conductive component. In order to avoid sedimentation and to ensure uniform polymer deposition the liquid medium 120 is continuously stirred and a constant temperature is maintained by a temperature stabilizing system (not shown).

A packaged component is disposed on or clamped between clamps of the first electrode 140. Under the influence of the electric field the charged organic molecules 125 deposit on a conductive surface of packaged component at the first electrode 140 and form a uniform organic material layer. At the same time an inorganic insulating material (e.g., inorganic elements or inorganic chemical compounds) with a high thermal conductivity is co-deposited. The charged organic molecules (e.g., monomers or polymers) 125 subsequently discharge to form a coherent uncharged organic/inorganic layer or coating (insulating layer or coating) on a conductive surface of the packaged component. In various embodiments more than one organic molecule types is deposited at the same time. In various embodiments more than one inorganic insulating material type is deposited at the same time. For example, a monomer and a polymer (or two different types of monomers or polymers) are deposited at the same time and/or boron nitride and aluminum oxide are deposited at the same time.

The insulating coating exhibits high thickness uniformity even when deposited on complex structures with difficult-to-reach surface portions. The insulating layer may be selectively deposited to specific conductive areas of the packaged component.

The initially high deposition rate of charged organic molecules 125 (and the inorganic insulting material) may eventually slow down due to the increased insulation of the deposited insulating coating. Thus, the EPD processes may be self-limiting to a certain extent.

In various embodiments the organic molecules (e.g., monomers or polymers) may be an epoxy resin or an acrylic resin. Alternatively, the organic molecules may comprise other monomers or polymers. The inorganic material (e.g., inorganic chemical elements or compounds) comprises boron nitride (BN) (dielectric strength: 95 ac-kv/mm and thermal conductivity: 30 W/m*K) or aluminum oxide ($Al_2O_3$) (dielectric strength: 17 ac-kv/mm and thermal conductivity: 18 W/m*K). Alternatively, the inorganic material may comprise other inorganic materials having a dielectric strength of equal or greater than 15 ac-kv/mm and a thermal conductivity of equal or greater than 15 W/m*K.

Figure 2:
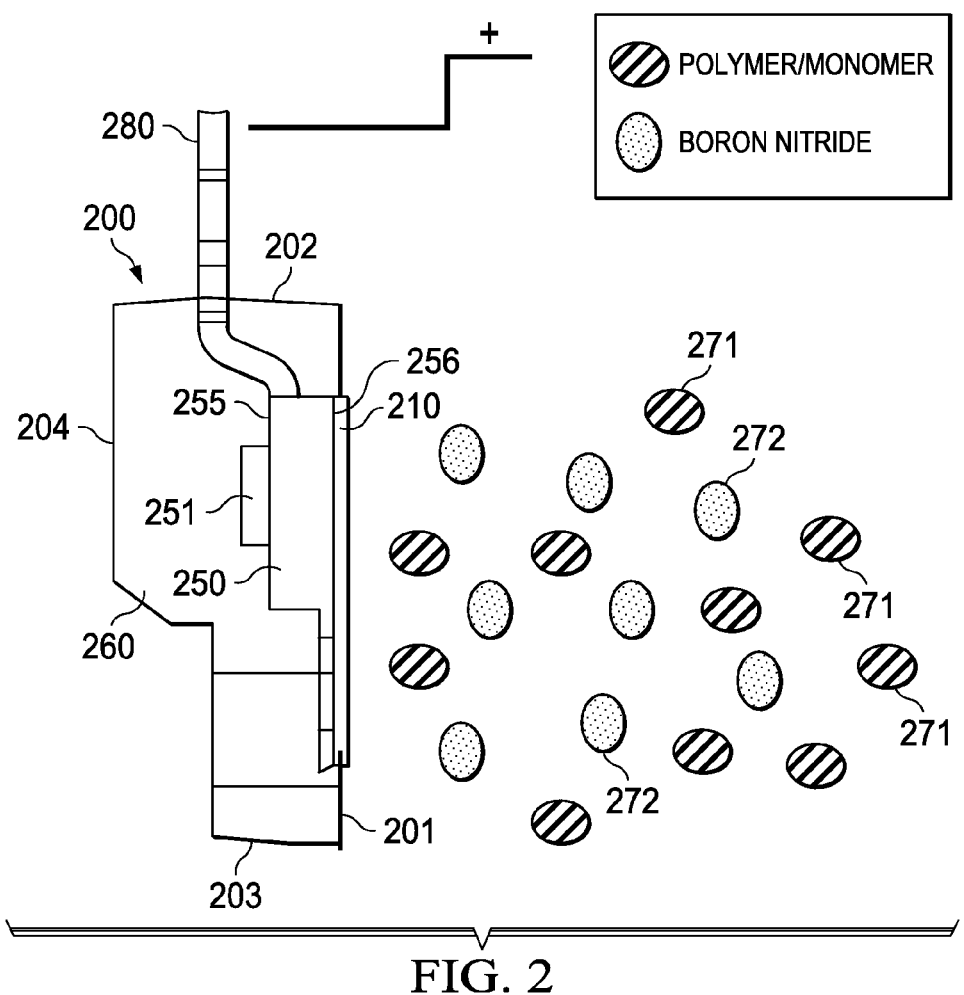
FIG. 2 illustrates an embodiment of an EPD process on a packaged component.

FIG. 2 illustrates an embodiment of a deposition of boron nitride and polymer molecules on a heat sink of a packaged component 200 based on an electrophoretic deposition (EPD) process. The packaged component 200 comprises a component 250 and a heat sink or a component carrier 210. The packaged component 200 further comprises leads 280. The leads 280 are connected to a positive potential or to the first electrode of the EPD process tool of FIG. 1.

The component 250 comprises a first main surface or top surface 255 and a second main surface or bottom surface 256. The top surface 255 may be the front side of the component 250 and the bottom surface 256 may be the backside of the component 250. In some embodiments, the first main surface 255 is the surface where the active areas are predominately disposed and the second main surface 256 is the surface which is active area free or which is predominately active area free.

The component 250 comprises a substrate. The substrate may be a semiconductor substrate such as silicon or germanium, or a compound substrate such as SiGe, GaAs, InP, GaN or SiC. The substrate may be doped or undoped and may comprise one or more wells. The semiconductor substrate may be a single crystal silicon or a silicon-on insulator (SOI). One or more interconnect metallization layers may be arranged on the substrate. A passivation layer may be disposed on the interconnect metallization layers to electrically isolate and/or structure component contact pads of the component 250.

The component 250 may be a chip or die. The component 250 may comprise a discrete chip such as a single semiconductor chip or an integrated circuit (IC) chip. For example, the component 250 may comprise a semiconductor device such as a MOSFET or a power semiconductor device such as a bipolar transistor, an insulated gate bipolar transistor (IGBT), a power MOSFET, a thyristor or a diode. Alternatively, the component 250 may be a resistor, a protective device, a capacitor, a sensor or a detector, for example. The component 250 may be a system on chip (SoC). In some embodiments, the component 250 comprises a discrete transistor chip, wherein the top surface 255 comprises a source (or alternatively drain), and the bottom surface 256 comprises a drain (or alternatively source).

In some embodiments, a further component 251 is disposed on the component 250. The further component 251 may drive or switch the component 250. In one example, the component 250 is a discrete power semiconductor switch chip and the further component 251 is a logic chip configured to switch the discrete power semiconductor switch.

The component carrier 210 may comprise a conductive material, a leadframe, or a printed circuit board (PCB). At least a portion of the component carrier 210 may be a heat sink. In one embodiment the component carrier 210 is a leadframe comprising a metal such as copper (Cu) or copper alloy, nickel (Ni) or nickel alloy, silver (Ag) or silver alloy, or a combination thereof.

The component 250 is attached to the component carrier 210 at the component placement area. For example, the bottom surface 256 of the component 250 is attached to the top surface of the component carrier 210. In various embodiments the component 250 is bonded to the component carrier 210 via a soft solder connection (bonding) or diffusion solder connection (bonding). In alternative embodiments the component 250 is bonded or glued to the component carrier 210 via a conductive adhesive connection such as a conductive adhesive layer or a conductive adhesive tape.

In various embodiments the heat sink 210 is disposed over the entire bottom surface 201 of the packaged component 200. In alternative embodiments the heat sink 210 is disposed over a portion or region of the bottom surface 201 of the packaged component 200. In some embodiments the heat sink 210 may comprise substantially the same area as the bottom surface 256 of the component 250. In yet other alternative embodiments the heat sink 210 may comprise a larger area than the bottom surface 256 of the component 250 but a smaller area than the bottom surface 201 of the packaged component 200.

In various embodiments the packaged component 200 further comprises conductive connection elements such as conductive clips or wire bonds connecting the component 250 to at least one of the leads 280. For example, component contacts or component contact pads disposed on a top surface 255 of the component 250 are bonded to some of the leads 280 while the component contact pad on the bottom surface 256 of the component 250 is bonded to other lead(s) 280. The conductive connection elements may comprise a metal such as aluminum (Al), copper (Cu), silver (Ag) or gold (Au).

The packaged component 200 may further comprise an encapsulation body 260. The encapsulation body 260 encapsulates at least portions of the component 250, the conductive connection elements, and the component carrier 210. At least portions of the leads 280 and portions of the component carrier 210 may not be encapsulated.

The encapsulation body 260 may comprise a polymer. For example, the polymer may comprise acrylic resins, polyurethane resins, epoxy resins, epoxy resins with an anime type hardener or polar high performance thermoplastics. Alternatively, the encapsulation body 260 may comprise a monomer. Suitable monomers may comprise at least one functional group such as an amine-structure, an acid-structure, a carbonyl-structure, a sulfonate-structure, an isocyanate-structure or a hydroxyl-structure.

In some embodiments the encapsulation body 260 may comprise the same package height at side 202 where the leads 280 protrude out of the encapsulation body 260 and the opposite side 203. In alternative embodiments the two sides 202, 203 of the encapsulation body 260 comprise different package heights, e.g., the side 202 where the leads 280 protrude out of the encapsulation body 260 is higher than the opposite side 203.

In various embodiments the leads 280 of the packaged component 200 are in the same plane as the heat sink 210. In alternative embodiments the leads 280 of the packaged component 200 are in different planes. In some embodiments the heat sink 210 is not located on the bottom surface 201 of the packaged component 200 but at the top surface 204.

FIG. 2 further shows how the polymer molecules 271 and the boron nitride elements 272 move toward the heat sink 210 when the packaged component 200 (in particular, the heat sink 210) is put on a positive potential.

Figure 3A:
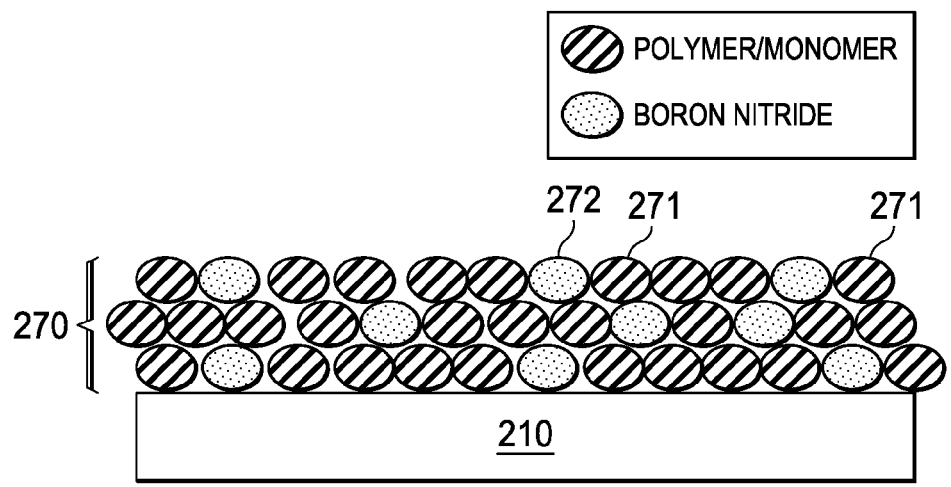
FIG. 3a illustrates an embodiment of the EPD deposited layer.

FIG. 3a shows an insulating layer 270 of polymer molecules 271 and boron nitride elements 272 that are formed on the heat sink 210 (e.g., copper heat sink). The polymer molecules 271 and the boron nitrides 272 are properly stacked and organized.

Figure 3B:
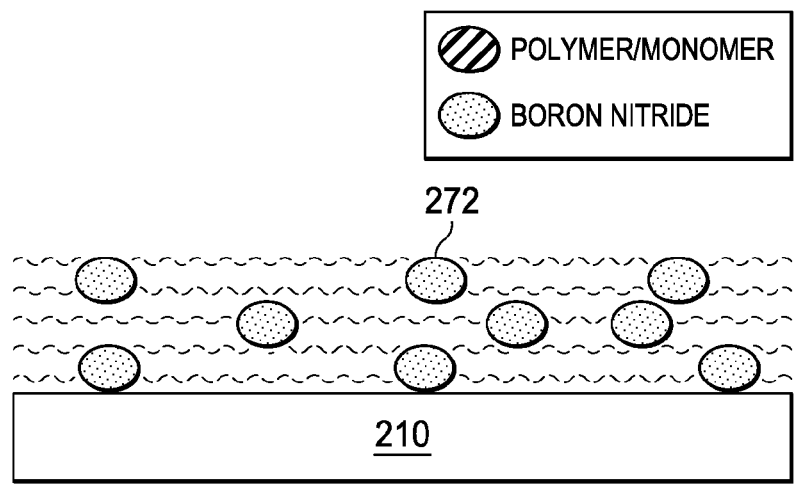
FIG. 3b illustrates an embodiment of the EPD deposited layer after curing.

FIG. 3b shows the insulating layer 270 after it is cured in an oven such as a vacuum oven. The polymer molecules 271 are polymerized and air and/or water is outgassed. In various embodiments the boron nitride 272 remains as individual elements in the polymerized insulating layer 270.

In various embodiments the polymer molecules 271 are other organic molecules such as monomer molecules and the boron nitride is another inorganic material such as aluminum oxide.

Figure 4:
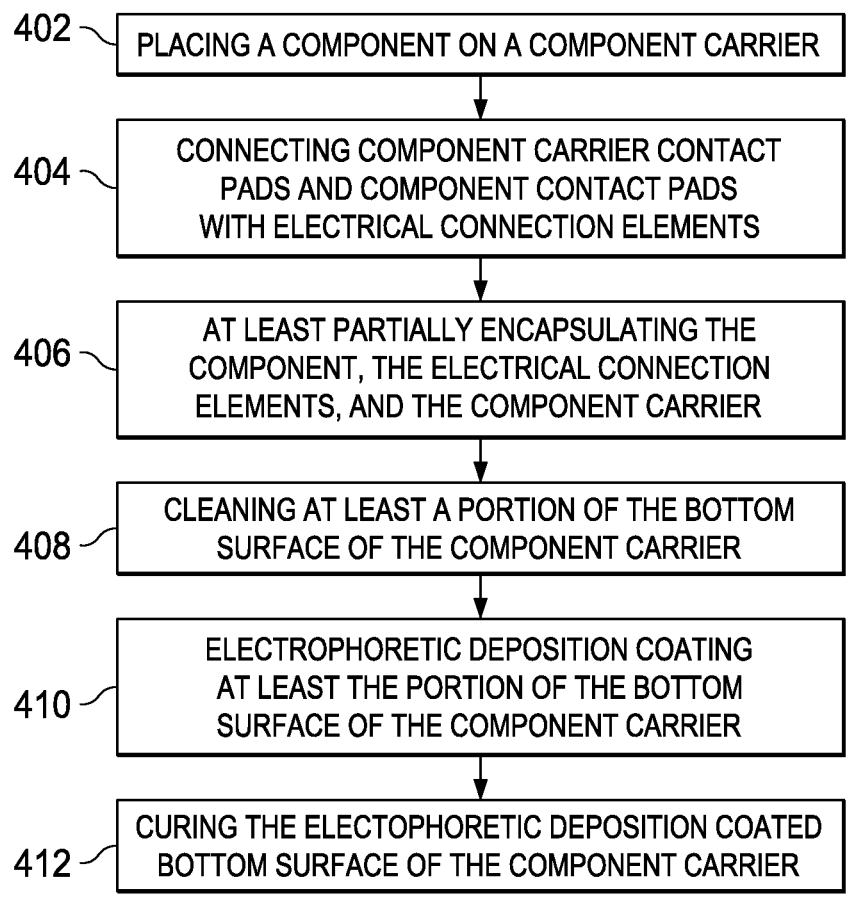
FIG. 4 illustrates an embodiment of a method for manufacturing a packaged component.

FIG. 4 shows an embodiment of a method for manufacturing a packaged component 400. In a first step 402, a component is placed on and attached to a component carrier. The component and the component carrier may be the same as described with respect to FIG. 2. For example, the component is a power semiconductor chip and the component carrier is a leadframe, wherein the drain (alternatively source) contact of the power semiconductor chip is connected to the leadframe on the placement area. The leadframe comprises a heat sink. The heat sink may be a portion of the leadframe.

The bottom surface of the component is attached to the component carrier. In some embodiments a metal layer disposed on the bottom surface of the component is bonded to the top surface of the component carrier using soldering, eutectic bonding or epoxy bonding. In other embodiments, the bottom surface of the component is bonded or glued to the top surface of the component carrier using a conductive adhesive tape, a solder paste or a solder tape.

In step 404, the component carrier contact pads (e.g., leads) are connected to the component contact pad(s) of the component. Conductive connection elements connect the component carrier contact pads with the component contact pad(s). The conductive connection elements may be conductive clips or bond wires. The conductive connection elements may be wire bonded, ball bonded, clip bonded or otherwise bonded. For example, the source of the power semiconductor chip is connected to a first lead and the gate of the power semiconductor chip is connected to a second lead. The drain of the power semiconductor chip is connected to the third lead (e.g., either via a conductive connection element or via the leadframe).

In step 406, the component, the component carrier and the conductive connection elements are at least partially encapsulated with an encapsulation body. For example, the component, the component carrier and the conductive connection elements are encapsulated with a molding compound. The molding compound may comprise a thermoset material or a thermoplastic material. In some embodiments, the molding compound may comprise a coarse grain material. In other embodiment the molding compound may be applied to encapsulate the component and at least portions of the component carrier. In some embodiments the encapsulation material may be a laminate material such as a prepreg material.

In step 408, at least a portion of the bottom surface of the component carrier (e.g., the heat sink) is cleaned. The surface cleaning may improve the adhesion properties of the surface to be covered by the insulating layer. The cleaning solution may be an alkaline cleaner comprising sodium hydroxide or potassium hydroxide and an acid pickle comprising sulfuric acid. A phosphating bath may help to improve the surface adhesion.

In step 410 at least the portion of the bottom surface of the component carrier (e.g., the heat sink) is EPD coated using embodiments of the invention. The organic molecules and the inorganic materials are co-deposited forming the insulating layer with a high dielectric strength and excellent thermal conductivity.

The packaged component may be disposed or clamped to a first electrode of an electrophoretic deposition (EPD) tool. Then the packaged component (with the first electrode) is immersed into the liquid medium. In various embodiments the packaged component is immersed partially into the liquid medium. For example, the packaged component is immersed into the liquid so that only the heat sink but not the leads are covered by the liquid medium. In other embodiments the packaged component is completely immersed into the liquid medium.

In various embodiments an anodic EPD process is used. In other embodiments a cationic EPD process is used. In some embodiments the anodic deposition comprises $2H_2O \rightarrow O_2$ (gas)$+4H^+ +4\ e^-$. The emulsion monomer/polymer deposits and reacts via $(aq)^- + H^+$.

In various embodiments the deposited insulating layer may comprise monomer molecules or polymer molecules (e.g., epoxy resins or acrylic resins) and an inorganic material having a dielectric strength of equal or greater than 15 ac-kv/mm and a thermal conductivity of equal or greater than 15 W/m*K. The inorganic material may be boron nitride or aluminum oxide.

In the optional step 412 the EPD insulating layer is cured in a vacuum oven. For example, the deposited material is cured at temperatures between 100° C. and 200° C. or, alternatively, between 150° C. and 160° C. In various embodiments air and/or water is removed from the deposited insulating material. The curing may polymerize the deposited monomer molecules or polymer molecules. The inorganic material may not become polymerized and may remain as individual elements in the insulation layer.

The insulating film may be about 5 µm to about 30 µm thick, or alternatively, about 8 µm to about 15 µm thick. In some embodiments, the insulating film may be less than 35 µm, less than 20 µm, or less than 10 µm thick.

In various embodiments the heat sink may be coated with an electrically insulating thin film or an electrically insulating ultra-thin film. The film may provide excellent thermal conductivity.

Advantages of embodiments of the present invention are fast polymer or monomer coating of packaged components, systems or devices. In particular, the packaged components, systems or devices can be processed in parallel and in large numbers. In comparison to other coating techniques heat may be not applied. Accordingly, thermo-mechanical stress during coating is reduced to a minimum. For example, warpages of leadframes during coating could be prevented by the EPD technique.

Other advantages of embodiments of the present invention are uniform deposition of an electrically insulating layer on complex surfaces. For example, an electrically insulating layer on three-dimensional structures of components/packaged components can be conformal deposited.

In various embodiments the EPD film may coat other surfaces (other than the heat sink) of packaged component such as (other portions of) the leadframe, the conductive connection elements and/or the top surface of the component. For example, the top surface of the component may be coated with the EPD film if it is exposed (e.g., not covered by the encapsulation material). Moreover, the leads may be coated with the EPD film except for the regions where they are configured to be connected to a separate component or device.

In various embodiments any conductive or metallic surface of the packaged component can be chosen to be EPD coated (e.g., co-deposition of organic molecules and inorganic material(s)). For example, the top surface of the component and the conductive connection elements are EPD coated while the component carrier is not (e.g., because the component carrier is a non-conductive substrate, the component carrier is masked or not immersed).

In various other embodiments the packaged component is EPD coated (e.g., co-deposition of organic molecules and inorganic material(s)) before the (assembled) packaged component is encapsulated with the encapsulation body. The pre-packaged component (system) is partially or completely immersed and the conductive surfaces are covered with an insulating layer.

In yet other embodiments different elements of the packaged component are EPD coated (e.g., co-deposition of organic molecules and inorganic material(s)) before they are assembled. For example, portions of the component carrier are EPD coated, portions of the component are EPD coated and/or portions of the conductive connecting elements are EPD coated before they are assembled. Further embodiments may be applied to examples described in U.S. application Ser. No. 13/620,202, filed on Sep. 14, 2012, which is incorporated herein by reference for all purposes.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A packaged component comprising:
a chip carrier comprising a chip attach area and leads;
a chip disposed on the chip attach area on a first side of the chip carrier; and
an electrically insulating layer disposed on an electrically conductive surface of a second side of the chip carrier, wherein the insulating layer comprises a polymer and an inorganic material comprising a dielectric strength of equal or greater than 15 ac-kv/mm and a thermal conductivity of equal or greater than 15 W/m*K; and
an encapsulation body at least partially encapsulating the chip carrier and the chip, wherein the leads protrude from the encapsulation body.

2. The packaged component according to claim 1, wherein the polymer comprises an epoxy resin and the inorganic material comprises boron nitride.

3. The packaged component according to claim 1, wherein the polymer comprises an epoxy resin and the inorganic material comprises aluminum oxide.

4. The packaged component according to claim 1, wherein the polymer comprises an acrylic resin and the inorganic material comprises boron nitride.

5. The packaged component according to claim 1, wherein the polymer comprises an acrylic resin and the inorganic material comprises aluminum oxide.

6. The packaged component according to claim 1, wherein the electrically conductive surface is a heat sink, and wherein the heat sink is a portion of the chip carrier.

7. The packaged component according to claim 6, wherein the insulating layer comprises a thickness of less than 35 μm.

8. A packaged component comprising:
a component carrier;
a component disposed on a first side of the component carrier;
an encapsulation body at least partially encapsulating the component carrier and the component; and
an electrically insulating layer disposed on a second side of the component carrier, wherein the insulating layer comprises a polymer and an inorganic material comprising a dielectric strength of equal or greater than 15 ac-kv/mm and a thermal conductivity of equal or greater than 15 W/m*K.

9. The packaged component according to claim 8, wherein the polymer comprises an epoxy resin and the inorganic material comprises boron nitride.

10. The packaged component according to claim 8, wherein the polymer comprises an epoxy resin and the inorganic material comprises aluminum oxide.

11. The packaged component according to claim 8, wherein the polymer comprises an acrylic resin and the inorganic material comprises boron nitride.

12. The packaged component according to claim 8, wherein the polymer comprises an acrylic resin and the inorganic material comprises aluminum oxide.

13. The packaged component according to claim 8, wherein the component carrier is a leadframe and the component comprises a power semiconductor chip.

14. The packaged component according to claim 13, wherein the component further comprises a logic chip disposed on the power semiconductor chip.

15. A system comprising:
a component carrier;
a component disposed on the component carrier; and
an electrically insulating layer disposed on an electrically conductive surface of the component, wherein the insulating layer comprises a polymer and an inorganic material comprising a dielectric strength of equal or greater than 15 ac-kv/mm and a thermal conductivity of equal or greater than 15 W/m*K.

16. The system according to claim 15, wherein the polymer comprises an epoxy resin and the inorganic material comprises boron nitride.

17. The system according to claim 15, wherein the polymer comprises an epoxy resin and the inorganic material comprises aluminum oxide.

18. The system according to claim 15, wherein the polymer comprises an acrylic resin and the inorganic material comprises boron nitride.

19. The system according to claim 15, wherein the polymer comprises an acrylic resin and the inorganic material comprises aluminum oxide.

20. The system according to claim 15, wherein the insulating layer is disposed directly on an electrically conductive surface of the component.

* * * * *